United States Patent
Lin

(10) Patent No.: US 8,805,630 B2
(45) Date of Patent: Aug. 12, 2014

(54) METHOD AND SYSTEM FOR MODELING IN SEMICONDUCTOR FABRICATION

(75) Inventor: Chun-Hsien Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 797 days.

(21) Appl. No.: 12/546,860

(22) Filed: Aug. 25, 2009

(65) Prior Publication Data

US 2011/0054819 A1 Mar. 3, 2011

(51) Int. Cl.
*G01N 37/00* (2006.01)
*G06F 19/00* (2011.01)
*H01L 21/66* (2006.01)

(52) U.S. Cl.
USPC .............................. 702/84; 700/108; 438/14

(58) Field of Classification Search
USPC ........ 703/1, 2, 13, 14, 15; 702/84, 81, 83, 86, 702/109, 117, 118, 123, 179, 182, 183, 702/184; 700/95, 96, 97, 108, 109, 110, 700/117, 121; 438/14, 18
See application file for complete search history.

(56) References Cited

U.S. PATENT DOCUMENTS

| | | |
|---|---|---|
| 7,144,297 B2 | 12/2006 | Lin et al. |
| 2009/0292506 A1* | 11/2009 | MacDonald et al. ......... 702/185 |
| 2010/0141948 A1* | 6/2010 | Cohen et al. .................. 356/369 |
| 2010/0146475 A1* | 6/2010 | Cao et al. ........................ 716/19 |
| 2010/0167183 A1* | 7/2010 | Hsu et al. ........................... 430/5 |

* cited by examiner

*Primary Examiner* — Sujoy Kundu
*Assistant Examiner* — Ricky Ngon
(74) *Attorney, Agent, or Firm* — Haynes and Boone, LLP

(57) ABSTRACT

A method for use in semiconductor fabrication is provided that includes providing manufacturing data of a semiconductor process, providing a plurality of functional transformations, optimizing each of the functional transformations based on the manufacturing data, selecting one of the functional transformations that has a least deviation with respect to the manufacturing data, predicting performance of the semiconductor process using the selected transformation function, and controlling a fabrication tool based on the predicted performance.

20 Claims, 4 Drawing Sheets

METHOD AND SYSTEM FOR MODELING IN SEMICONDUCTOR FABRICATION

BACKGROUND

Semiconductor integrated circuits are produced by a plurality of processes in a wafer fabrication facility (fab). These processes, and associated fabrication tools, may include thermal oxidation, diffusion, ion implantation, RTP (rapid thermal processing), CVD (chemical vapor deposition), PVD (physical vapor deposition), epitaxy, etch, and photolithography. During the fabrication stages, semiconductor wafers are monitored for quality assurance and yield using various metrology tools. As feature sizes are reduced, the amount of monitoring and controlling may need to be increased. This, however, increases costs by the increased quantity of metrology tools required, the increased manpower to perform the monitoring and controlling, and the associated delay in manufacturing cycle time. Computer Integrated Manufacturing (CIM) is an emerging technology that utilizes virtual metrology for wafer acceptance testing (WAT). Virtual metrology is a technique that predicts results of a semiconductor process based on modeling. As semiconductor fabrication progresses to advanced technology node processes (e.g., 90 nm to 65 nm to 45 nm to 32 nm), the prediction error of virtual metrology needs to be reduced to satisfy tighter control specifications.

SUMMARY

One of the broader forms of an embodiment of the present invention involves a method. Manufacturing data of a semiconductor process is provided. A plurality of functional transformations are provided. Each of the functional transformations is optimized based on the manufacturing data. One of the functional transformations that has a least deviation with respect to the manufacturing data is selected. Performance of the semiconductor process using the selected functional transformation is predicted. A fabrication tool is controlled based on the predicted performance.

Another one of the broader forms of an embodiment of the present invention involves a method. Manufacturing data including wafer data and first tool data associated with a semiconductor process that was performed on a first wafer is collected. A pool of functions including non-linear functions is provided, each function is configured to model the semiconductor process. Each of the functions in the pool is optimized based on the manufacturing data. One of the functions in the pool that has a least deviation with respect to the manufacturing data is selected. A result of the semiconductor process is determined using the selected function and second tool data. A fabrication tool is controlled based on the determined result, the fabrication tool is operable to perform the semiconductor process on a second wafer.

Yet another one of the broader forms of an embodiment of the present invention involves a semiconductor fabrication system. A first module provides manufacturing data including wafer data and tool data associated with a semiconductor process. A second module provides a plurality of functional transformations. A virtual metrology module is operable to: optimize each of functional transformations based on the manufacturing data, select one of the functional transformations that has a least deviation with respect to the manufacturing data, and predict performance of the semiconductor process using the selected functional transformation. A controller is operable to receive the predicted performance to control the semiconductor process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
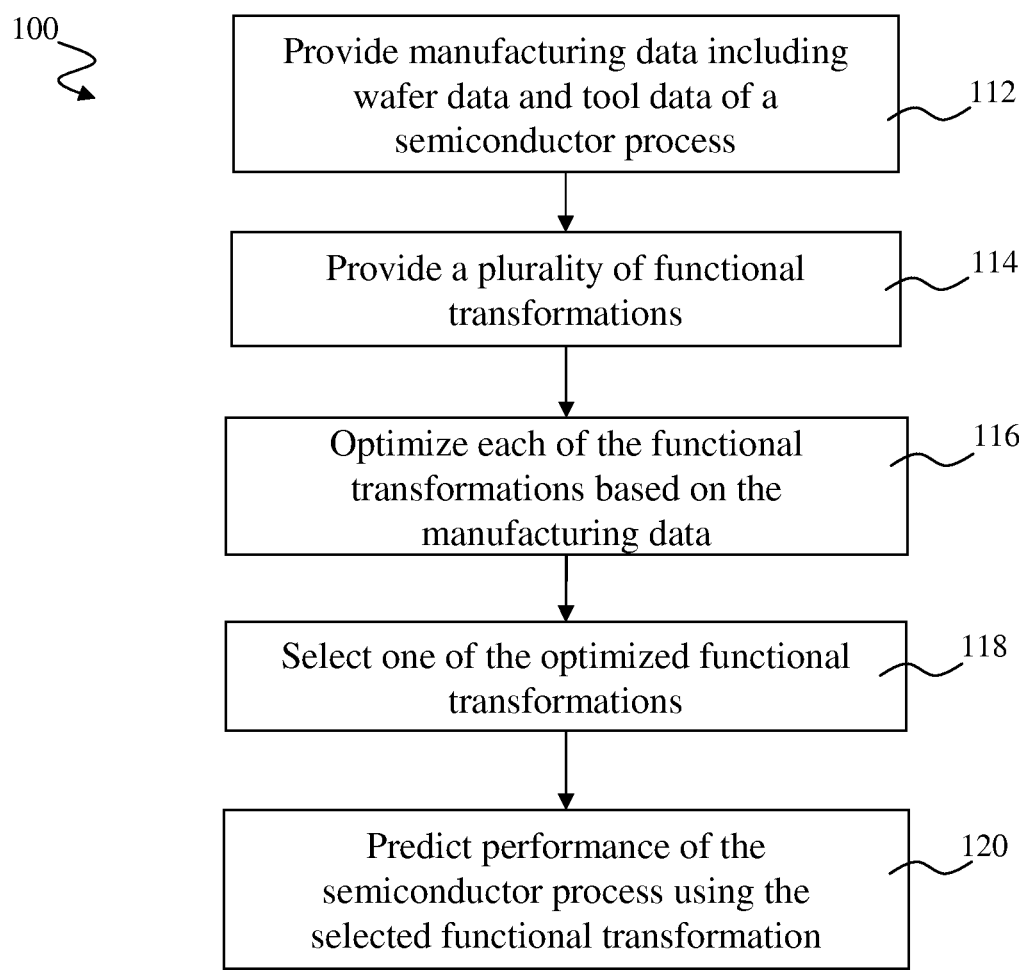
FIG. 1 illustrates a flowchart of an embodiment of a method of modeling a semiconductor process according to various aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
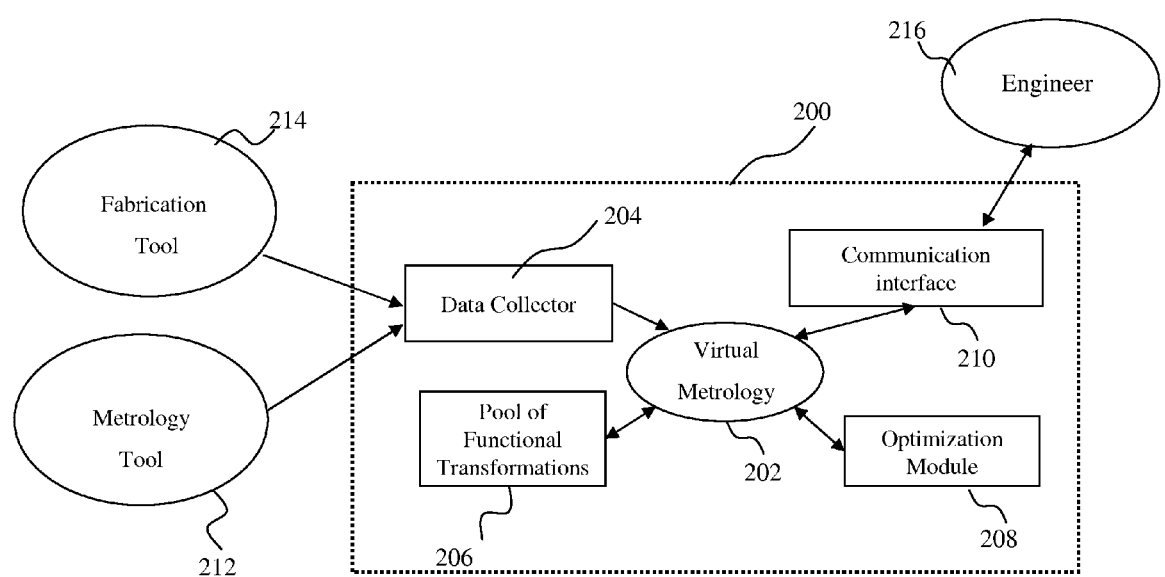
FIG. 2 illustrates a block diagram of an embodiment of a virtual metrology (VM) system for performing the method of FIG. 1 according to various aspects of the present disclosure.

FIG. 1 is a flowchart of a method 100 for modeling a semiconductor process according to an embodiment of the present disclosure. Illustrated in FIG. 2 is a block diagram of one embodiment of a virtual metrology (VM) system 200 that can perform the method 100 of FIG. 1. The method 100 and the VM system 200 are described below, with reference to FIGS. 1 and 2.

The method 100 begins with block 112 in which manufacturing data including wafer data and tool data of a semiconductor process is provided. The VM system 200 includes a virtual metrology (VM) module 202 that is operable to perform actions including manipulating information, receiving information, storing information, and transferring information. The information may include, for example, commands, process parameters such as those parameters used in process recipes, manufacturing data, advanced process control parameters, and fabrication tool status. The VM system 200 further includes a data collector module 204, a pool of functional transformations module 206, an optimization module 208, and a communication interface module 210.

The data collector module 204 is operable for collecting manufacturing data. The manufacturing data includes wafer data collected from a metrology tool 212 and tool data collected from a fabrication tool 214. The wafer data and tool data represent data of a semiconductor process that has been performed on a number of wafers. The manufacturing data are provided to the VM module 202 for analyzing and modeling as will be explained later.

The metrology tool 212 may include electrical, optical, and/or analytical tools, such as microscopes, micro-analytical tools, line width measurement tools, mask and reticle defects tools, particle distribution tools, surface analysis tools, stress analysis tools, resistivity and contact resistance measurement tools, mobility and carrier concentration measurement tools, depth measurement tools, film thickness measurement tools, gates oxide integrity test tools, C-V measurement tools, focused ion beam, and other test and measurement tools. The wafer data may include wafer results such as wafer parameters measured by the metrology tools. The wafer parameters may comprise trench depth, sheet resistance, reflectivity, stress, particle density, and critical dimension, to name a few. The wafer data may further comprise other data such as wafer ID and product type.

The fabrication tool 214 may be, for example, an etching system, a chemical vapor deposition (CVD) system, a physical vapor deposition (PVD) system, a thermal oxidation system, an ion implantation system, a chemical mechanical polishing (CMP) system, a rapid thermal annealing (RTA) system, a photolithography system, or other proper semiconductor fabrication systems. The tool data may include setting values of process parameters (or process parameter setting data). In CMP, for example, the process parameters may include polishing pressure, platen rotational speed, slurry distribution rate, slurry temperature, and wafer temperature. In PVD, as another example, the process parameters may include heater temperature, wafer temperature, radio frequency (RF) bias reflected power, RF side reflected power, RF top reflected power, chamber pressure, gas partial pressures, and chuck voltage. The process parameters may comprise other parameters not included in a process recipe such as sputtering target thickness and spacing between the target and the wafer for the PVD tool. The tool data may further comprise other data such as tool ID, tool maintenance history, and material specification (such as slurry composition in CMP and sputtering target in PVD).

As an example, a semiconductor wafer ("wafer"), either individually or in batch, is processed through various process steps. One process step may be performed in the fabrication tool 214. Other process steps may be performed in other fabrication tools. The fabrication tool 214 may be programmed, set, and configured according to a process recipe when the wafer is processed therein. The process recipe may define a plurality of sub-steps. For example, a PVD tool recipe may define following sub-processes: gas, ramp, stabilization, deposition, and pump-down. Each sub-process may be defined with a certain time duration and may set various hardware parameters to certain levels. After the wafer completes the process step in the fabrication tool according to the process recipe, one or more of the metrology tools may be utilized to test and measure the wafer to get wafer data or results. The manufacturing data, including wafer data and tool data, may be collected by the data collector 204 from the metrology tool 212 and the fabrication tool 214, respectively, and stored in memory.

The method 100 continues with block 114 in which a pool of functional transformations is provided. The pool of functional transformations module 206 comprises various functional transformations (e.g., $f_1$, $f_2$, $f_3$, . . . $f_n$) that include non-linear functions and/or linear functions. For example, the functional transformations include: a sigmoid function $$y=f(x)=1/(1+e^{(-ax+b)})$$

a hypertangent function $$y=f(x)=\tan h(ax+b)$$

a logarithmic function $$y=f(x)=\log_a(x)$$

an exponential function $$y=f(x)=e^{(ax)}$$

where a and b are coefficients. It should be noted that the number of coefficients may vary depending on the complexity of the functional transformation. Further, it is understood that the functional transformations disclosed above are mere examples, and that any one to one (reversible) mapping transformation can be utilized. The functional transformations in the pool module 206 may be provided to the VM module 202 for modeling a semiconductor process as will be explained later.

The method 100 continues with block 116 in which each of the functional transformations in the pool are optimized based on the manufacturing data. The optimization module 208 includes an algorithm that optimizes each functional transformation in the pool module 206 based on the manufacturing data. As previously noted, the manufacturing data includes wafer data and tool data of a semiconductor process that has been performed on wafers. Each functional transformation may be used to model the semiconductor process by which a process result (e.g., "y" variable) can be expressed as a function of a process parameter (e.g., "x" variable). It should be noted that the process result of the semiconductor process may depend on more than one process parameter but is simplified herein for the sake of discussion. The optimization algorithm is performed to determine optimal coefficients for the respective functional transformation with respect to the set of wafer data (e.g., process result) and tool data (e.g., process parameter). That is, the optimization algorithm determines the values of the coefficients of the functional transformation so that the optimized functional transformation best fits the manufacturing data. For example, in the case of a sigmoid function ($y=f(x)=1/(1+e^{(-ax+b)})$), the optimization algorithm would determine the values of coefficients "a" and "b" that would best fit the sigmoid function with the given set data points of wafer data (e.g., "y" values) and tool data (e.g., "x" values). There are various numerical techniques that can be used for curve-fitting analysis. One such numerical technique is discussed below.

The technique implements a Levenberg-Marquardt algorithm (LMA) to minimize a function (generally non-linear function) over a set of parameters of the function. LMA is a numerical solution that determines optimal values of the coefficients of the function. It is understood the LMA is known in art and thus is only described briefly herein. For each functional transformation (e.g., $f_1(x)$, $f_2(x)$, $f_3(x)$, . . . $f_n(x)$), one or more coefficients may be represented by a vector β. In continuation with the present example, in case of a sigmoid function, there are two coefficients "a" and "b", and thus the vector β=(a, b). The LMA optimizes β of the function f(x, β) for a given set of data points of independent and dependent variables ($x_i$, $y_i$) so that the sum S of the squares of the deviations becomes minimal. The sum S can be expressed by the following equation:

$$S(B) = \sum_{i=1}^{m} [y_i - f(x_i, B)]^2$$

where m is the total number of data points in the given set.

The LMA is an iterative process. To start the minimization process, an initial estimate for the vector β is provided, and the sum of squares S calculated. In each iteration step, the vector β is replaced by a new estimate (β+δ). This is repeated until the reduction of the sum S from the latest vector (β+δ) falls below a predefined limit. The predefined limit may be set to comply with design or control requirements. Accordingly, the latest vector determines the optimal coefficients of the functional transformation. It should be noted in cases where the sum S approaches zero, the closer the functional transformation exactly fits the given set of data points. The number of iterations may vary and may depend on the initial estimate of the vector β and the predefined limit for changes in the sum S at each iteration. It is understood that LMA is a mere example and that other numerical methods for curve-fitting may be used.

The method 100 continues with block 118 in which one of the functional transformation in the pool is selected. After the optimization process, the functional transformation that has the least deviation with respect to the manufacturing data is selected to model the semiconductor process. In block 116, the LMA was performed on each of the functional transformations to determine the optimized coefficients based on the manufacturing data. Accordingly, the minimal sum (e.g., $S_1$, $S_2$, $S_3$, ... $S_n$) of squares was determined for each functional transformation (e.g., $f_1(x)$, $f_2(x)$, $f_3(x)$, ... $f_n(x)$). The VM module 202 selects the optimized functional transformation having the smallest sum S of squares (e.g., closest to zero). The functional transformation having the smallest sum S represents the function that has a least deviation with respect to the manufacturing data. Accordingly, the selected functional transformation will provide minimal prediction error as compared to the non-selected functional transformations.

The method 100 continues with block 120 in which performance of the semiconductor process is predicted using the selected functional transformation. The VM module 202 uses the selected functional transformation to predict performance of the semiconductor process on wafers being processed. For example, the wafers may be processed by the fabrication tool 214 and the process parameters have been set in accordance with the specified process recipe. Additionally, current tool data from the fabrication tool 214 can be collected in real-time and routed to pertinent modules of the VM system 200 for analysis. The VM module 202 applies the current tool data to the selected functional transformation (block 118) to predict a process result (or wafer result) of the semiconductor process. The predicted wafer result may be sent out to pertinent engineers or customers of the fab. Further, the predicted wafer result may be fed forward to control subsequent semiconductor processes or may be fed backward to tune the current semiconductor process. Additionally, the predicted wafer result may be used to adjust the process recipe for subsequent wafers. Accordingly, the VM system 200 may be used to substitute for the physical metrology operations that are performed by an engineer using metrology tools (e.g., metrology tool 212) in order to measure actual wafer results. Thus, the VM system 200 can be implemented in Computer Integrated Manufacturing (CIM) applications so that the predicted results may used to determine whether the wafers are within design specifications for virtual wafer acceptance testing (WAT).

For example, the communication interface 210 may communicate the predicted wafer result within the semiconductor fabrication environment. For example, the predicted wafer result may be sent to engineers 216 for evaluation, production monitor, and/or process improvement. The engineers 216 may communicate with the VM system 200 through the communication interface 210. The communication interface 210 may even provide an alarm to the engineers 216 when the predicted wafer results are out of a predefined range, has apparent shifting, or has other serious changes. The predicted wafer result may be sent to a data control center such as a manufacturing execution system (MES) system wherein the predicted wafer result may be further processed, organized, and distributed for data monitoring, evaluation, analysis, and/or control such as statistical process control (SPC). The predicted wafer result may be sent to a fabrication tool at a next semiconductor process, wherein the process recipe and process parameters may be adjusted to compensate for any drifting and/or shifting from the current semiconductor process for optimized wafer quality, performance, and yield.

The VM system 200 of FIG. 2 serves as an example to the present disclosure. Each module thereof may comprise software and/or hardware to implement its functions. For example, the VM module 202 may comprise hardware such as computer and memory for operation and storage. The VM module 202 may also comprise software for providing an operating environment. The VM system 200 may further comprise a database including all process parameters, manufacturing data, pool of functional transformations, and optimization algorithms. Each module may be well configured, connected to other modules and other components of the semiconductor fabrication environment. The VM system 200 may be configured and organized in different ways such as with less or more modules without departure from the spirit of the present disclosure.

Figure 3:
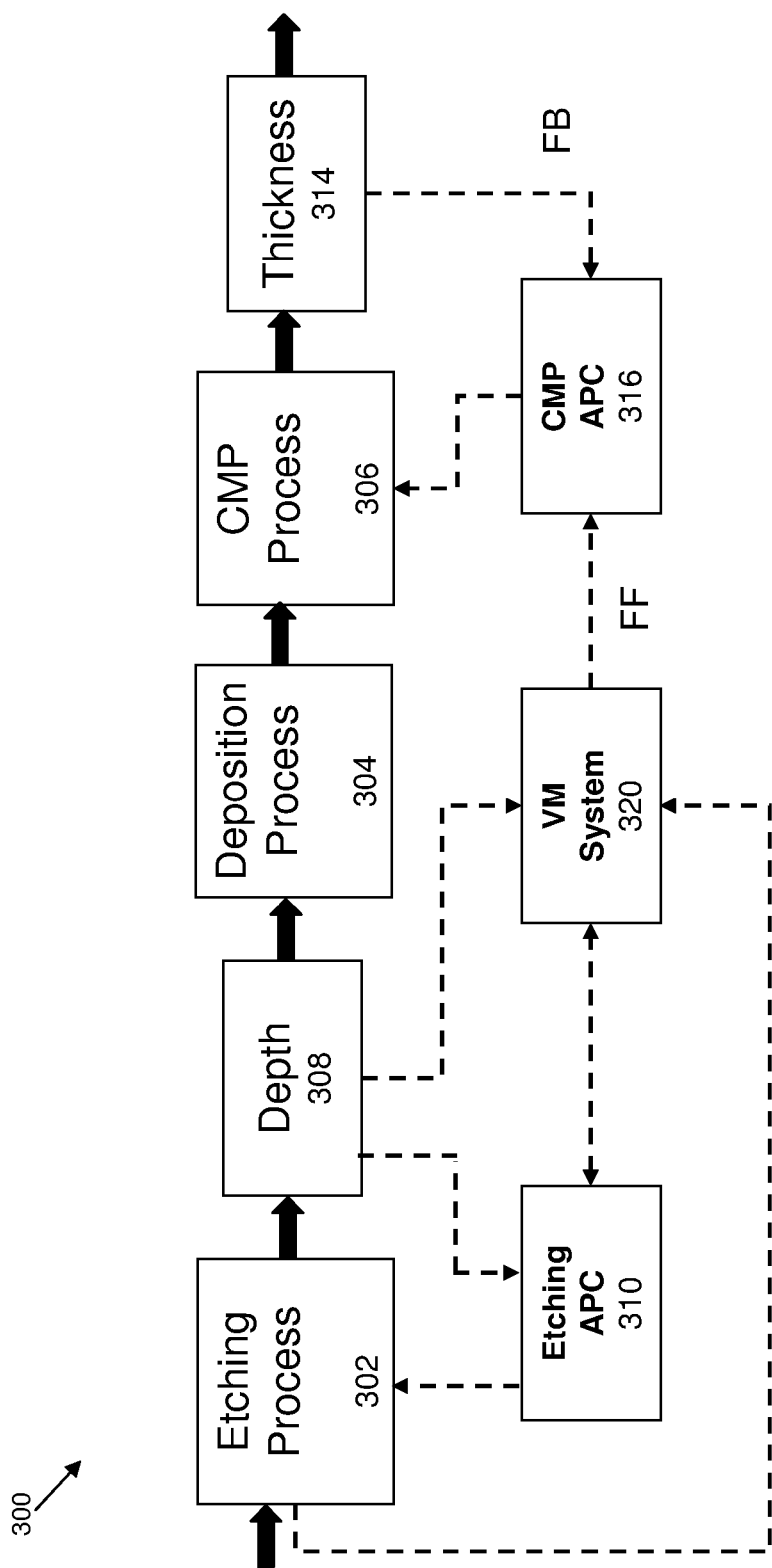
FIG. 3 illustrates a block diagram of an embodiment of part of a semiconductor fabrication process flow according to various aspects of the present disclosure.

Referring to FIG. 3, illustrated is a block diagram of part of semiconductor fabrication process flow 300. The process flow 300 includes material process flow, illustrated as solid lines, and an information flow, illustrated as dashed lines. The material process flow includes processes for fabricating a semiconductor substrate, such as, for example, a wafer. It is understood that multiple wafers are likely to be processed in lots, as such, the reference to a wafer in the singular in the present disclosure does not by necessity limit the disclosure to a single wafer, but may be illustrative of a lot including a plurality of wafers, a plurality of lots, or any such grouping of material. The process flow 300 includes an etching process 302, a deposition process 304, and a chemical mechanical polishing (CMP) process 306.

The etching process 302 may include one or more an etching chambers (e.g., fabrication tool) operable to perform an etch process (e.g., semiconductor process). In the present example, the etching process 302 etches a trench in a material layer formed on the wafer. A wafer result of the etching process 302 includes a trench depth 308. The etching process 302 may be controlled by an etching advanced process control (APC) 310. The etching APC 310 evaluates information corresponding to various parameters of the etching process 302, such as etching rate, and determines a control parameter, such as an etch time, that will achieve a desired trench depth. Information associated with the trench depth 308 can be fed backward to the etching APC to tune the process parameters for more accurate control of the etching process 302.

The deposition process 304 may include a PVD system, CVD system, or other suitable deposition system. In the present example, the deposition process 304 is operable to deposit a conductive material, such as copper (Cu), to fill the trenches. It is understood that deposition process 304 may be controlled by a deposition APC (not shown).

The CMP process 306 is operable to planarize the wafer. In the present example, the CMP process 306 removes the conductive layer outside of the trenches. A wafer result of the CMP process 306 includes a thickness 314. The CMP process 306 may be controlled by a CMP APC 316. The CMP APC 316 evaluates information corresponding to various process parameters of the CMP process 306, such as polishing rate, and determines a control parameter, such as a polishing time that will achieve a desired thickness. Information associated with the thickness 314 can be fed backward to the CMP APC 316 to tune the process parameters for more accurate control of the CMP process 306.

The process flow 300 further includes a virtual metrology (VM) system 320 similar to the VM system 200 of FIG. 2. The VM system 320 is operable to predict a wafer result, such as trench depth, of the etching process 302 in accordance with the method 100 of FIG. 1. The VM system 320 may receive information including current tool data from the etching chamber of the etching process 302. The etching APC 310 and the VM system 320 may communicate with each other to exchange information associated with the etching process. For example, the etching APC 310 may provide the etching time that will be used on the wafers to be processed. The VM system 320 analyzes the information including current tool data to predict a trench depth of the etching process 302 that is being performed on the wafers, and provides the predicted trench depth to the CMP APC 316. The CMP APC 316 can use the predicted trench depth to enable more elaborate polishing time tuning for the wafers when they are transferred to the CMP process 306 for processing. Accordingly, the predicted wafer results can substitute for the actual measurements of trench depths performed by an engineer using metrology tools, and thus can decrease manufacturing cycle time. Further, the VM system 320 may also receive information from inline monitoring tools that provide statistical process control (SPC) information associated with the trench depth. The SPC information may be used to verify and evaluate a prediction error of the functional transformation that was used by the VM system 320. The prediction error can determine whether the predictions are within control specifications. If not, the VM system 320 can further tune and/or adjust the functional transformation that was used to model the etching process 302.

Figure 4:
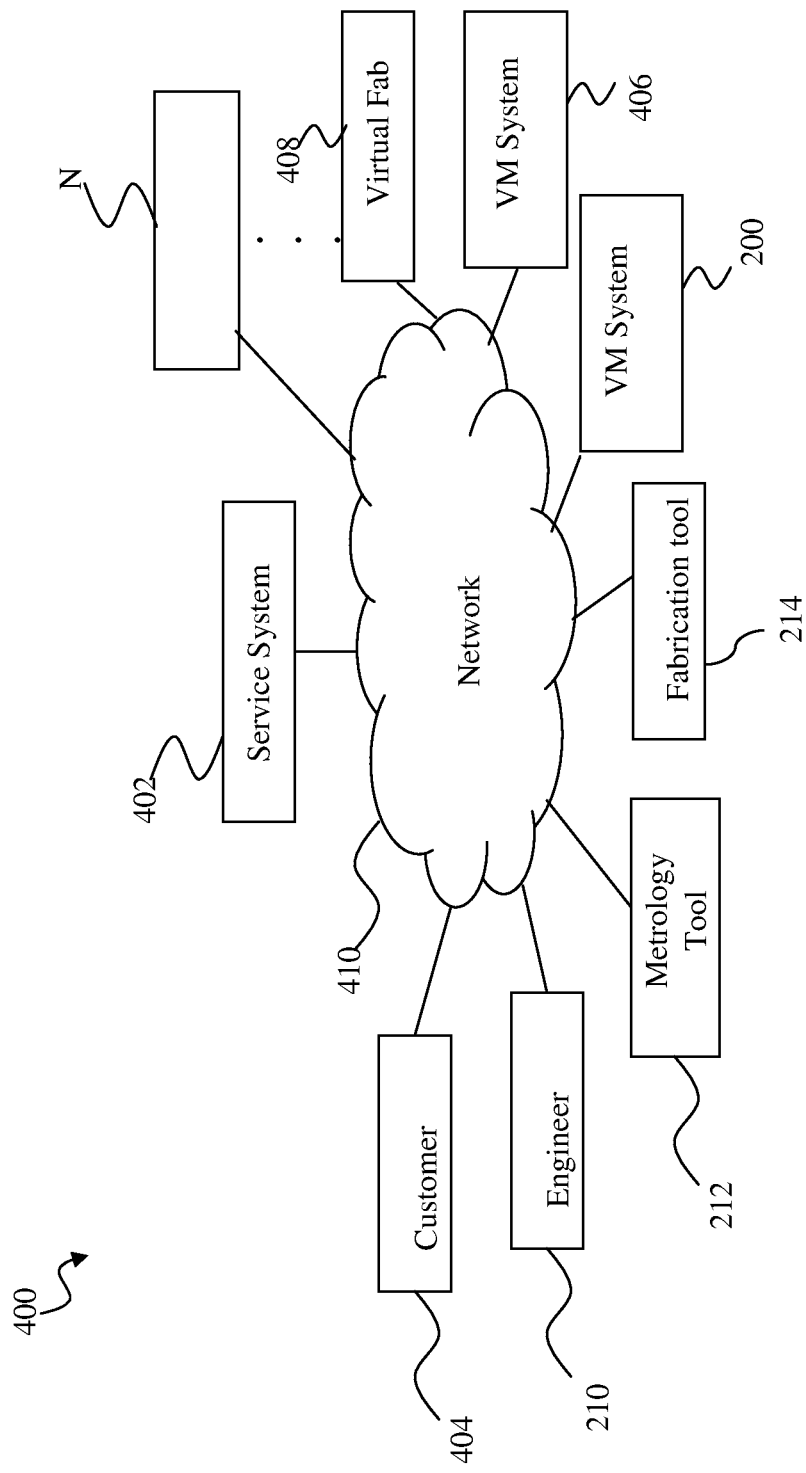
FIG. 4 illustrates a block diagram of a virtual fabrication system within which the VM system of FIG. 2 can be implemented according to various aspects of the present disclosure.

FIG. 4 illustrates a virtual semiconductor fabrication system (a "virtual fab") 400 within which the VM system 200 of FIG. 2 can be implemented. Similar features in FIG. 2 and The virtual fab 400 includes a plurality of entities 402, 404, 210, 212, 214, 200, 406, 408, . . . N that are connected by a communications network 410. The network 410 may be a single network or may be a variety of different networks, such as an intranet and the Internet, and may include both wireline and wireless communication channels.

In the present example, the entity 402 represents a service system for service collaboration and provision, the entity 404 represents a customer, the entity 210 represents an engineer, the entity 212 represents a metrology tool (or facility) for testing and measurement, the entity 214 represents a fabrication tool, the entity 200 represents a virtual sensor system associated with the fabrication tool 214, the entity 406 represents a second virtual sensor system (e.g., associated with another fabrication tool which may also be an entity), and the entity 408 represents another virtual fab (e.g., a virtual fab belonging to a subsidiary or a business partner). Each entity may interact with other entities and may provide services to and/or receive services from the other entities.

For purposes of illustration, each entity may be referred to as an internal entity (e.g., an engineer, customer service personnel, an automated system process, a design or fabrication facility, etc.) that forms a portion of the virtual fab 400 or may be referred to as an external entity (e.g., a customer) that interacts with the virtual fab 400. It is understood that the entities may be concentrated at a single location or may be distributed, and that some entities may be incorporated into other entities. In addition, each entity may be associated with system identification information that allows access to information within the system to be controlled based upon authority levels associated with each entities identification information.

The virtual fab 400 enables interaction among the entities for the purpose of IC manufacturing, as well as the provision of services. In the present example, IC manufacturing includes receiving a customer's IC order and the associated operations needed to produce the ordered ICs and send them to the customer, such as the design, fabrication, testing, and shipping of the ICs.

One of the services provided by the virtual fab 400 may enable collaboration and information access in such areas as design, engineering, and logistics. For example, in the design area, the customer 404 may be given access to information and tools related to the design of their product via the service system 402. The tools may enable the customer 404 to perform yield enhancement analyses, view layout information, and obtain similar information. In the engineering area, the engineer 210 may collaborate with other engineers using fabrication information regarding pilot yield runs, risk analysis, quality, and reliability. The logistics area may provide the customer 404 with fabrication status, testing results, order handling, and shipping dates. It is understood that these areas are exemplary, and that more or less information may be made available via the virtual fab 400 as desired.

Another service provided by the virtual fab 400 may integrate systems between facilities, such as between the metrology tool/facility 212 and the fab tool 214. Such integration enables facilities to coordinate their activities. For example, integrating the metrology tool 212 and the fab tool 214 may enable manufacturing information to be incorporated more efficiently into the fabrication process, and may enable wafer data from the metrology tools 212 to be returned to the fab tool 214 for improvement and incorporation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing manufacturing data of a semiconductor process performed with a fabrication tool, the manufacturing data including a set of wafer data and a set of tool data;
providing a plurality of functional transformation equations, each functional transformation equation being different;
optimizing, with a virtual metrology system, each of the functional transformation equations using the same set of wafer data and the same set of tool data;
selecting, with the virtual metrology system, one of the functional transformation equations that has a least deviation with respect to the set of wafer data and the set of tool data;
predicting, with the virtual metrology system, performance of the semiconductor process using the selected functional transformation equation; and controlling the fabrication tool based on the predicted performance.

2. The method of claim 1, wherein providing the manufacturing data includes:
   collecting the wafer data from a metrology tool, the wafer data being associated with a wafer that has been processed by the semiconductor process; and
   collecting the tool data from the fabrication tool, the tool data being associated with the wafer data.

3. The method of claim 1, wherein the functional transformation equations include non-linear functional transformation equations.

4. The method of claim 3, wherein optimizing each of the functional transformation equations includes performing a Levenberg-Marquardt minimization process on each of the functional transformation equations thereby optimizing one or more coefficients of each of the functional transformation equations.

5. The method of claim 4, wherein selecting one of the functional transformation equations includes:
   determining a sum of squares of deviations of each of the optimized functional transformation equations with respect to the manufacturing data; and
   selecting the functional transformation equation having the sum closest to zero.

6. The method of claim 1, wherein predicting performance of the semiconductor process includes:
   providing real-time tool data from the fabrication tool that is operable to perform the semiconductor process on a wafer; and
   applying the real-time tool data to the selected functional transformation equation to predict a result of the semiconductor process.

7. The method of claim 6, further comprising feeding forward the predicted result to control a subsequent semiconductor process that is to be performed on the wafer.

8. The method of claim 6, further comprising feeding back the predicted result to tune the semiconductor process that is to be performed on another wafer.

9. A method, comprising:
   collecting manufacturing data including a set of wafer data and a first set of tool data associated with a semiconductor process that was performed on a first wafer;
   providing a pool of functions including non-linear functions, each function being different and configured to model the semiconductor process;
   optimizing, with a virtual metrology system, each of the different functions in the pool based on the same set of wafer data and the same first set of tool data;
   selecting, with the virtual metrology system, one of the functions in the pool that has a least deviation with respect to the set of wafer data and the first set of tool data;
   determining, with the virtual metrology system, a result of the semiconductor process using the selected function and second set of tool data different from the first set of tool data; and
   controlling a fabrication tool based on the predicted result, the fabrication tool being operable to perform the semiconductor process on a second wafer.

10. The method of claim 9, wherein optimizing each of the functions includes performing a Levenberg-Marquardt minimization process on each of the functions thereby determining, for each function, a sum of squares of deviations with respect to the set of wafer data and the first set of tool data.

11. The method of claim 10, wherein selecting one of the functions in the pool includes selecting the function having the sum closest to zero.

12. The method of claim 9, further comprising comparing the determined result with a measured result of the second wafer after it has been processed.

13. The method of claim 12, further comprising adjusting the selected function based on the comparison.

14. The method of claim 9, further comprising feeding forward the determined result to tune a subsequent semiconductor process that is to be performed on the second wafer.

15. A semiconductor fabrication system, comprising:
   a first module for providing manufacturing data including a set of wafer data and a set of tool data associated with a semiconductor process;
   a second module for providing a plurality of functional transformation equations, each functional transformation equation being different;
   a virtual metrology module operable to:
      optimize each of functional transformation equations using the same set of wafer data and the same set of tool data;
      select one of the functional transformation equations that has a least deviation with respect to the set of wafer data and the set of tool data; and
      predict performance of the semiconductor process using the selected functional transformation equation; and
   a controller operable to receive the predicted performance to control a fabrication tool associated with the semiconductor process.

16. The system of claim 15, wherein the virtual metrology module uses real-time tool data from the fabrication tool and the selected functional transformation equation to predict a result of the semiconductor process on a wafer.

17. The system of claim 16, wherein the controller is operable to control another fabrication tool associated with another semiconductor process based on the predicted result.

18. The system of claim 17, wherein the semiconductor process includes an etching process, and the another semiconductor process is a chemical mechanical polishing (CMP) process.

19. The system of claim 15, wherein the virtual metrology module is operable to optimize each of the functional transformation equations by performing a Levenberg-Marquardt minimization process on each of the functional transformation equations thereby determining, for each functional transformation equation, a sum of squares of deviations with respect to the manufacturing data.

20. The system of claim 19, wherein the virtual metrology module is operable to select one of the functional transformation equations by selecting the functional transformation equation having the sum closest to zero.

* * * * *